(12) United States Patent
Sano et al.

(10) Patent No.: US 10,180,237 B2
(45) Date of Patent: Jan. 15, 2019

(54) LIGHT EMITTING DEVICE AND WAVELENGTH CONVERSION MEMBER

(71) Applicant: NICHIA CORPORATION, Anan-shi, Tokushima (JP)

(72) Inventors: Masahiko Sano, Anan (JP); Hiroaki Yuto, Awa (JP); Naoki Eboshi, Tokushima (JP); Toru Takasone, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 31 days.

(21) Appl. No.: 15/621,166

(22) Filed: Jun. 13, 2017

(65) Prior Publication Data

US 2017/0363269 A1 Dec. 21, 2017

(30) Foreign Application Priority Data

Jun. 17, 2016 (JP) .................................. 2016-120912

(51) Int. Cl.
*F21V 9/16* (2006.01)
*F21V 9/30* (2018.01)
*F21V 29/70* (2015.01)
*F21V 5/04* (2006.01)
*F21V 7/00* (2006.01)
(Continued)

(52) U.S. Cl.
CPC ............... *F21V 9/30* (2018.02); *F21K 9/64* (2016.08); *F21V 5/04* (2013.01); *F21V 7/00* (2013.01); *F21V 13/14* (2013.01); *F21V 29/70* (2015.01); *H01L 33/50* (2013.01); *H01S 5/005* (2013.01); *H05B 33/145* (2013.01); *F21V 7/26* (2018.02); *F21V 9/32* (2018.02); *F21Y 2115/30* (2016.08);
(Continued)

(58) Field of Classification Search
CPC ... F21V 9/30; F21V 9/32; F21V 29/70; F21V 5/04; F21V 7/00; F21V 7/26; H01S 5/005; H01L 33/50; H05B 33/145; F21K 9/64
See application file for complete search history.

(56) References Cited

U.S. PATENT DOCUMENTS 9,341,933 B2 * 5/2016 Jao ..................... G03B 21/2093
2011/0149549 A1   6/2011 Miyake

FOREIGN PATENT DOCUMENTS

JP    2011-129354 A    6/2011
JP    2011-165548 A    8/2011
(Continued)

*Primary Examiner* — Thomas M Sember
(74) *Attorney, Agent, or Firm* — Global IP Counselors, LLP

(57) ABSTRACT

A light emitting device includes a laser light, a wavelength conversion member, a base member and a lid. The wavelength conversion member includes a plurality of projected portions each extending along a first direction on an upper surface side thereof and arranged side by side in a second direction. Each of the plurality of projected portions has a first surface extending along the first direction. The first surface is inclined with respect to a reference surface. The laser light source and the wavelength conversion member are arranged so that an optical axis of first light from the laser light source extends along the second direction when viewed from above and is inclined with respect to the reference surface, and light directly incident to the first surface along a direction parallel to the optical axis of the first light is regularly reflected toward an upward direction.

15 Claims, 12 Drawing Sheets

(51) Int. Cl.
*F21V 13/14*         (2006.01)
*F21K 9/64*          (2016.01)
*H01S 5/00*          (2006.01)
*H01L 33/50*         (2010.01)
*H05B 33/14*         (2006.01)
*F21Y 115/30*        (2016.01)
*F21V 7/26*          (2018.01)
*F21V 9/32*          (2018.01)
*H01S 5/022*         (2006.01)

(52) U.S. Cl.
CPC ....... *H01S 5/02216* (2013.01); *H01S 5/02248* (2013.01); *H01S 5/02292* (2013.01)

(56) References Cited

FOREIGN PATENT DOCUMENTS

| | | |
|---|---|---|
| JP | 2012-109172 A | 6/2012 |
| JP | 2015-041475 A | 3/2015 |
| JP | 2015-232628 A | 12/2015 |

* cited by examiner

LIGHT EMITTING DEVICE AND WAVELENGTH CONVERSION MEMBER

CROSS-REFERENCE TO RELATED APPLICATION

The present application claims priority to Japanese Patent Application No. 2016-120912, filed on Jun. 17, 2016, the disclosure of which is hereby incorporated by reference in its entirety.

BACKGROUND

The present invention relates to a light emitting device and a wavelength conversion member.

A light source device including a semiconductor laser element, and a fluorescent material layer disposed separately from the semiconductor laser element is known (see Japanese Patent Application Laid-open No. 2011-129354). In such a light source device, the upper surface of a fluorescent material layer is irradiated with first light from a laser element, and the first light, and fluorescent light from the fluorescent material layer are extracted to the upper surface side. The laser element is disposed while avoiding an area directly above the fluorescent material layer so as not to obstruct the paths of the first light and fluorescent light from the fluorescent material layer.

SUMMARY

However, in such a light source device, first light reflected at the upper surface of a fluorescent material layer hardly travels in an upward direction. Specifically, since a part of the first light from a laser element may be approximately regularly reflected to the upper surface of the fluorescent material layer, the first light reflected at the upper surface of the fluorescent material layer travels principally to a side opposite to a side on which the laser element is disposed. On the other hand, fluorescent light from the fluorescent material layer tends to show a light distribution characteristic like a normal distribution having a maximum intensity in the upper part. Thus, for example, where an upward direction from the fluorescent material layer is a light extraction direction in the light source device, the first light regularly reflected at the upper surface of the fluorescent material layer is difficult to efficiently extract to the outside. Thus, a conventional light source device does not have sufficient light extraction efficiency.

The present application includes the following aspects. A light emitting device includes a laser light, a wavelength conversion member, a base member and a lid. The laser light source is configured to emit first light. The wavelength conversion member contains one kind of fluorescent material or a mixture of two or more kinds of fluorescent material, and configured to emit second light. The wavelength conversion member includes an upper surface arranged to be irradiated with the first light, and a plurality of projected portions each extending along a first direction on an upper surface side of the wavelength conversion member and arranged side by side in a second direction perpendicular to the first direction. Each of the plurality of projected portions has a first surface extending along the first direction. The first surface is inclined with respect to a reference surface on which bottoms of a plurality of grooves defined by the plurality of projected portions are arranged. The lid is bonded to the base member. The base member and the lid enclose the laser light source and the wavelength conversion member. The laser light source and the wavelength conversion member are arranged so that the first light and the second light are extracted from the upper surface side of the wavelength conversion member, an optical axis of the first light extends along the second direction when viewed from above and is inclined with respect to the reference surface, and light directly incident to the first surface along a direction parallel to the optical axis of the first light is regularly reflected toward an upward direction.

A wavelength conversion member includes an upper surface, one kind of fluorescent material or a mixture of two or more kinds of fluorescent material, and a plurality of projected portions. The plurality of projected portions each extending along a first direction on an upper surface side of the wavelength conversion member and arranged side by side in a second direction perpendicular to the first direction. Each of the plurality of projected portions has a first surface and a second surface. The first surface extends along the first direction and inclined with respect to a reference surface on which bottoms of a plurality of grooves defined by the plurality of projected portions are arranged. The second surface extends along the first direction when viewed from above and inclined with respect to the reference surface. The first surface is arranged so that light along the second direction when viewed from above and inclined with respect to the reference surface is regularly reflected toward an upward direction. The first surface and the second surface of each of the plurality of projected portions are arranged so that light regularly reflected at the second surface of one of the plurality of projected portions is regularly reflected toward the upward direction at the first surface of an adjacent one of the plurality of projected portions.

With the light emitting device, the first light can be reflected in the upward direction at the upper surface of the wavelength conversion member, and therefore light extraction efficiency can be improved. With the wavelength conversion member, a light emitting device having improved light extraction efficiency can be provided.

DETAILED DESCRIPTION

Hereinafter, an embodiment will be described with reference to the drawings as appropriate. It is to be noted that a light emitting device and a wavelength conversion member as described below are intended to implement the technical concept of the present invention, and the present invention is not limited to the following embodiment unless otherwise specified. The sizes, positional relations and so on of members shown in drawings may be exaggerated for clarification of explanation.

Figure 1A:
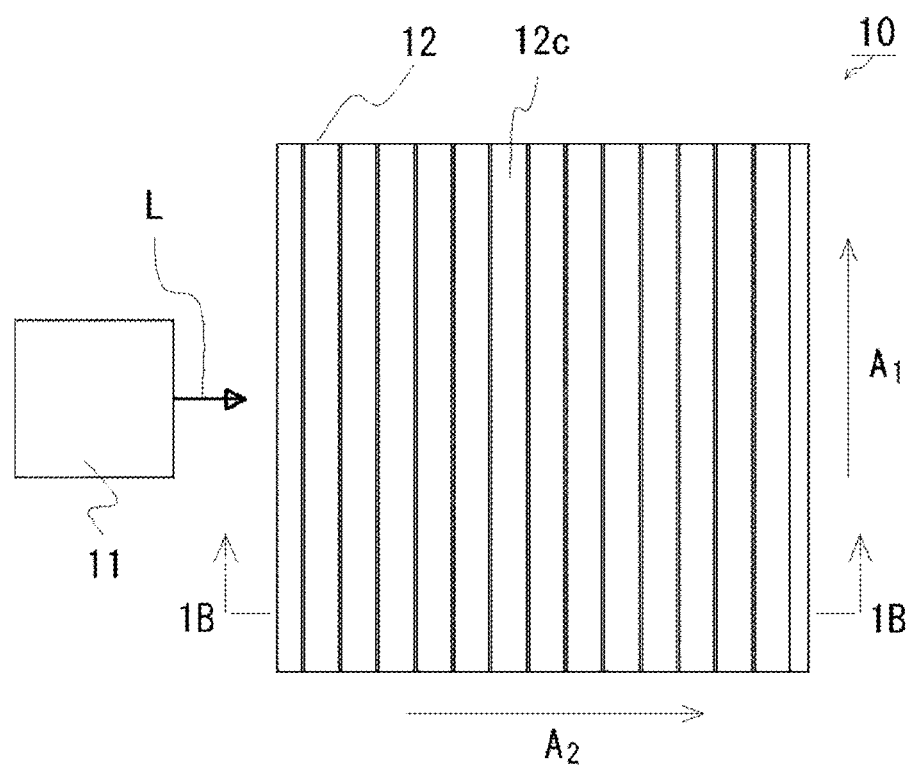
FIG. 1A is a schematic top view showing a light emitting device according to an embodiment.
Figure 1B:
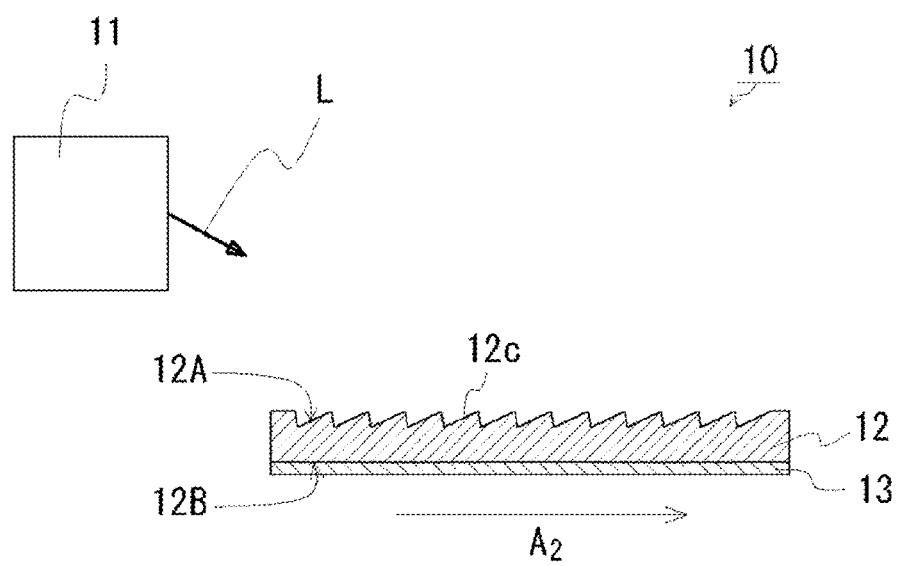
FIG. 1B is a schematic sectional view taken along line 1B-1B in FIG. 1A.

FIG. 1A is a schematic top view showing a light emitting device 10 according to one embodiment, and FIG. 1B is a schematic sectional view taken along line 1B-1B in FIG. 1A. The light emitting device 10 includes a laser light source 11 which emits first light and a wavelength conversion member 12 which has an upper surface 12A and emits second light. In the light emitting device 10, the upper surface 12A of the wavelength conversion member 12 is irradiated with the first light, and the first light and the second light are extracted from a side of the upper surface 12A of the wavelength conversion member 12. In FIGS. 1A and 1B, the optical axis of the first light is denoted by an arrow of symbol L. With the light emitting device 10, the first light can be easily reflected in an upward direction at the upper surface 12A of the wavelength conversion member 12, and therefore light extraction efficiency can be improved. Hereinafter, the wavelength conversion member 12, and the light emitting device 10 including the wavelength conversion member 12 will be described in detail.

(Wavelength Conversion Member 12)

The wavelength conversion member 12 has the upper surface 12A. The upper surface 12A is irradiated with the first light emitted from the laser light source 11, and the first light and the second light are extracted from the upper surface 12A side. The wavelength conversion member 12 contains one kind of fluorescent material and a mixture of two or more kinds of fluorescent material.

As shown in FIGS. 1A and 1B, the wavelength conversion member 12 has on the upper surface 12A side thereof a plurality of projected portions 12c. The plurality of projected portions 12c each extend in a first direction $A_1$, and are arranged side by side in a second direction $A_2$ perpendicular to the first direction $A_1$ when viewed from above. In the wavelength conversion member 12, the plurality of projected portions 12c is arranged so as to be connected in the second direction $A_2$.

Figure 2:
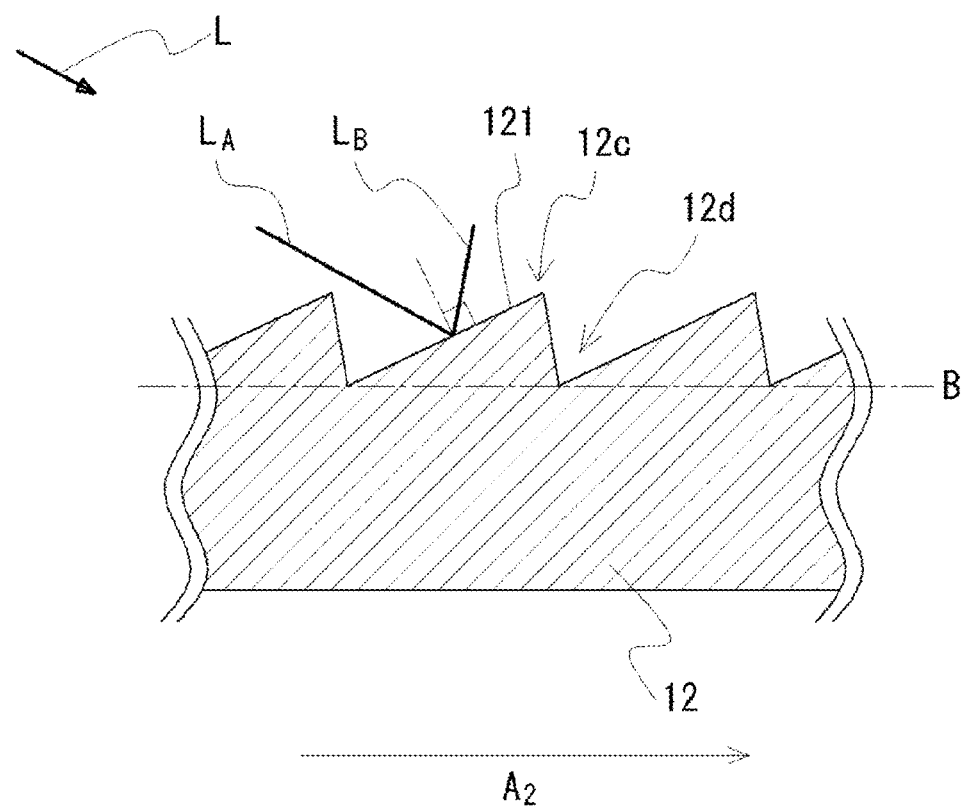
FIG. 2 is a partial enlarged view of FIG. 1B.

A partial enlarged view of FIG. 1B is shown in FIG. 2. FIG. 2 is a schematic view of the wavelength conversion member 12 at a cross-section extending perpendicularly to the first direction $A_1$. As shown in FIG. 2, the wavelength conversion member 12 is disposed in such a manner that the optical axis L of the first light extends along the second direction $A_2$, and is inclined with respect to a reference surface B when viewed from above provided that the reference surface B is a surface including the bottoms of the plurality of grooves 12d defined by the plurality of projected portions 12c. Each of the plurality of projected portions 12c has a first surface 121 extending in the first direction $A_1$ when viewed from above, the first surface 121 being inclined with respect to the reference surface B so that light directly incident to the first surface 121 along the optical axis L of the first light is regularly reflected in an upward direction. In this specification, the term "directly incident" means that light which is not reflected at the upper surface 12A of the wavelength conversion member is incident to a surface of the wavelength conversion member, and the term "directly incident" does not exclude a situation in which light passes through a lens etc. to be incident to a surface of the wavelength conversion member.

In the wavelength conversion member 12, the first light applied in a direction inclined with respect to the reference surface B is easily reflected in an upward direction owing to the first surface 121. The fluorescent material contained in the wavelength conversion member 12 is excited by the first light to emit fluorescent light (the second light) principally in an upward direction. Thus, the direction of the maximum intensity of the first light reflected by the wavelength conversion member 12 can be made close to the direction of the maximum intensity of the fluorescent light, and therefore the light emitting device 10 having improved light extraction efficiency can be provided. Further, the plurality of projected portions 12c each extend in the first direction $A_1$ when viewed from above. Accordingly, the first light can be reflected in an upward direction at a relatively wide flat surface as compared to a case where the upper surface 12A of the wavelength conversion member is merely roughened, and therefore a light source device having excellent light extraction efficiency can be obtained.

The first surface 121 of the projected portion 12c may be a surface having the following relationships with a straight line (line $L_A$ in FIG. 2) parallel to the optical axis L of the first light. First, the first surface 121 is a surface that is non-perpendicular to the line $L_A$ parallel to the optical axis L of the first light. Next, the line $L_A$ directly crosses the first surface 121 of one projected portion 12c. These relationships allow the first light to be directly incident on at least a part of the first surface 121. Further, as shown in FIG. 2, a straight line (line $L_B$ in FIG. 2) that is line-symmetric to the line $L_A$ with respect to a straight line normal to the first surface 121 is a line showing light travelling in an upward direction from the wavelength conversion member 12. When the first surface 121 has these relationships with the line $L_A$, the first light applied to the first surface 121 can be reflected in an upward direction.

The upward direction can also be referred to as a light extraction direction. For example, a range of approximately −30° to +30° with respect to a direction perpendicular to the reference surface B can be set to the upward direction. As described later, for example in the specific example of the light emitting device 10 shown in FIG. 4, a direction in which an opening of a lid 22 extends may be the upward direction. The upper surface 12A of the wavelength conversion member 12 is a surface which is irradiated with the first light.

Figure 3A:
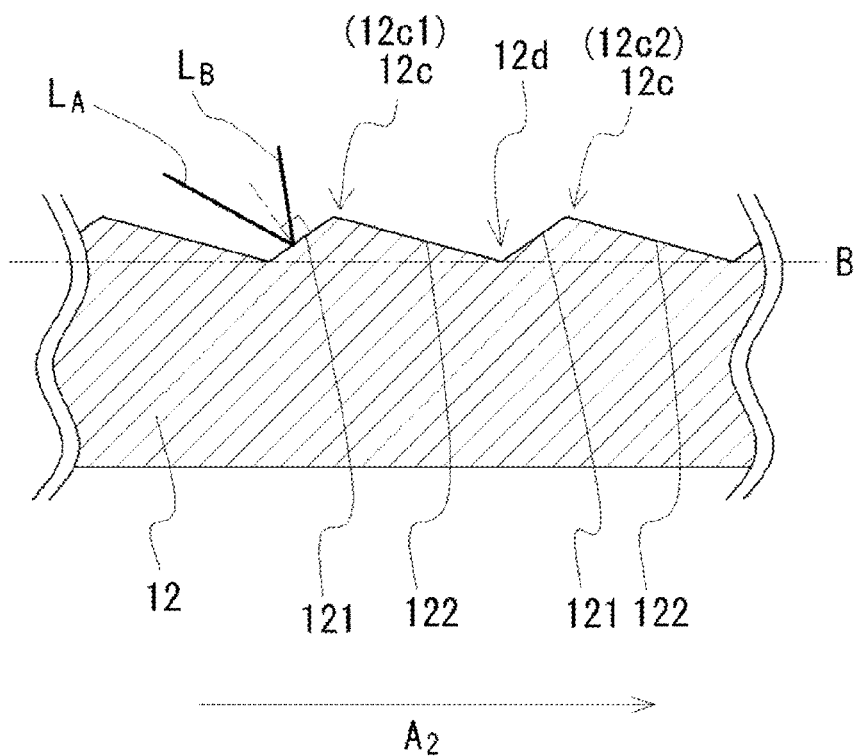
FIG. 3A is a schematic sectional view showing another example of projected portions.
Figure 3B:
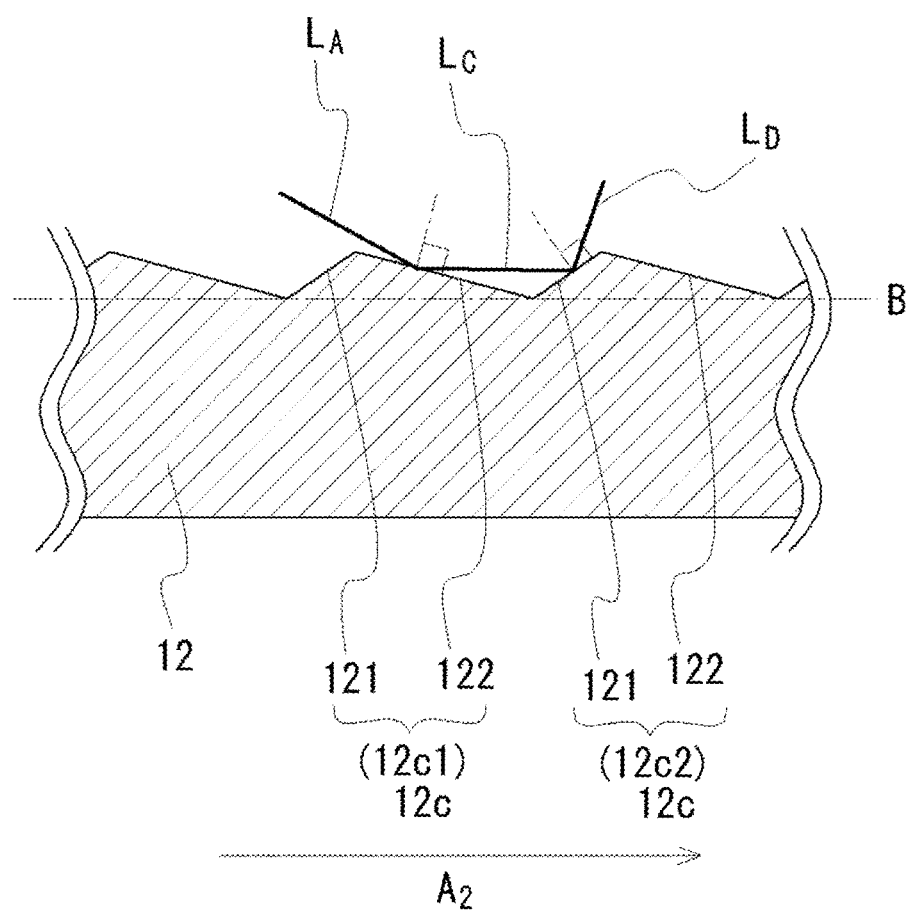
FIG. 3B is a schematic sectional view of a wavelength conversion member shown in FIG. 3A.
Figure 3C:
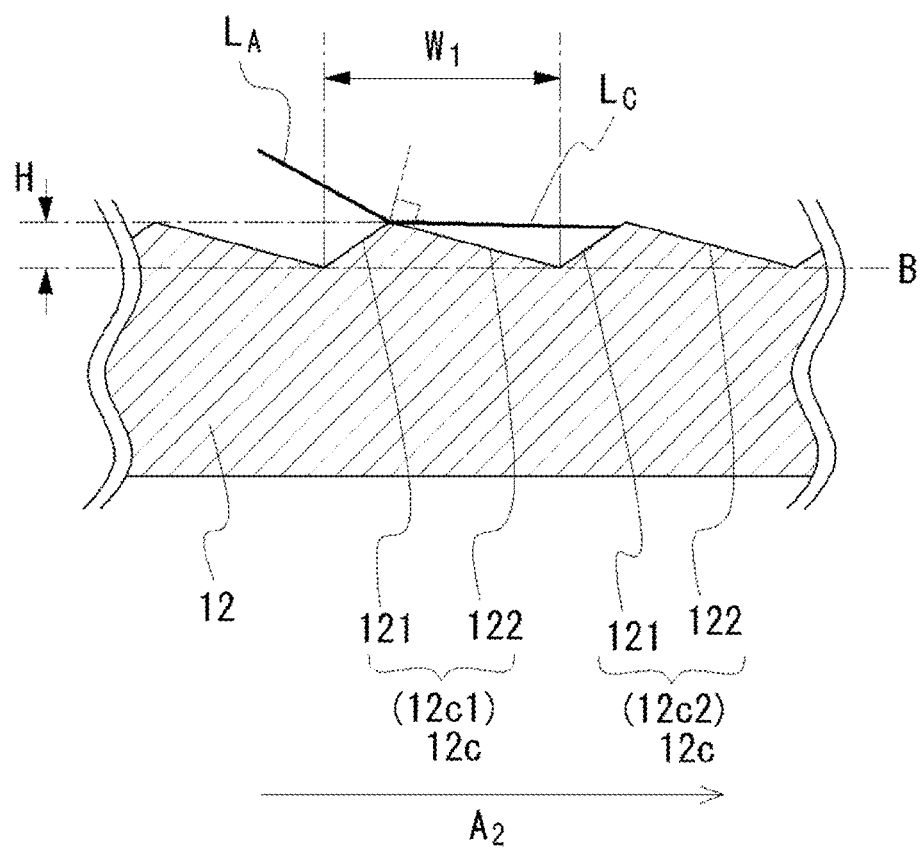
FIG. 3C is a schematic sectional view of the wavelength conversion member shown in FIG. 3A.

Another example of projected portions 12c is shown in FIGS. 3A to 3C. FIGS. 3A to 3C are schematic views of the wavelength conversion member 12 at a cross-section extending perpendicularly to the first direction $A_1$. As shown in FIGS. 3A to 3C, each of the plurality of projected portions 12c may further have a second surface 122. The second surface 122 is a surface which extends in the first direction $A_1$ when viewed from above, and to which light along the optical axis L of the first light is directly incident. The second surface 122 is inclined with respect to the reference surface B so that the first light regularly reflected at the second surface 122 of one projected portion (first projected portion 12c1) among the plurality of projected portions 12c is regularly reflected in an upward direction at the first surface 121 of other projected portion (second projected portion 12c2) adjacent to the first projected portion 12c1. As shown in FIGS. 3A to 3C, the first projected portion 12c1 and the second projected portion 12c2 are arranged side by side in this order from the side closest to a first light emitting port of the laser light source 11.

It is considered that by using the wavelength conversion member 12 having the second surface 122, the intensity distribution of light traveling in an upward direction from the wavelength conversion member 12 can be improved. In the case of the projected portion 12c shown in FIG. 2, the bottom of a groove 12d and an area in the vicinity thereof are hardly irradiated directly with the first light from the laser light source 11. Accordingly, the amount of fluorescent light from the fluorescent material is small at the bottom of the groove 12d and an area in the vicinity thereof. Thus, the light emission intensity distribution of mixed light of the first light and the second light becomes uneven. On the other hand, in the case of the wavelength conversion member 12 provided with projected portions 12c each having the second surface 122 as shown in FIGS. 3A to 3C, almost the whole of a region including the bottom of the groove 12d and an area in the vicinity thereof, i.e. a region extending from the second surface 122 of the first projected portion 12c1 to the first surface 121 of the second projected portion 12c2 can be irradiated directly with the first light from the laser light source 11. Accordingly, the fluorescent material can be excited in almost the whole of the region including the bottom of the groove 12d and an area in the vicinity thereof.

More specifically, the projected portions 12c shown in FIGS. 3A to 3C may have the first surface 121 and the second surface 122 which have the following relationships with the line $L_A$ parallel to the optical axis L of the first light. First, as shown in FIG. 3A, the first surface 121 is a surface that is non-perpendicular to the line $L_A$ parallel to the optical axis L, and the line $L_B$ that is line-symmetric to the line $L_A$ with respect to a straight line normal to the first surface 121 is a line showing light travelling in an upward direction from the wavelength conversion member 12. These projected portions are the same as the projected portions 12c shown in FIG. 2, but they are different in the following respects from the projected portions 12c shown in FIG. 2 and the projected portions 12c shown in FIGS. 3A to 3C. First, the line $L_A$ directly crosses the second surface 122 of the first projected portion 12c1 as shown in FIG. 3B. The first surface 121 of the second projected portion 12c2 is disposed at a position at which the line $L_A$ crosses a line $L_C$ that is line-symmetric to the line $L_A$ with respect to a straight line normal to the second surface 122 of the first projected portion 12c1. Further, a line $L_D$ that is line-symmetric to the line $L_C$ with respect to a straight line normal to the first surface 121 of the second projected portion 12c2 is a line showing light travelling in an upward direction from the wavelength conversion member 12. The projected portions 12c shown in FIGS. 3A to 3C are formed in such a manner that the first surface 121 and the line $L_A$ directly cross each other over the whole of the first surface 121, and therefore the second light can be extracted from almost the whole of a region extending from the lower end to the upper end of the first surface 121.

Preferably, the area of the second surface 122 is larger than the first surface 121 in each of the plurality of projected portions 12c as shown in FIGS. 3A to 3C. In other words, the width of the second surface 122 in the second direction $A_2$ is preferably larger than the width of the first surface 121 in the second direction $A_2$ when the lengths of the first surface 121 and the second surface 122 in the first direction $A_1$ are substantially equal to each other. Preferably, the first surface 121 of the second projected portion 12c2 is disposed at a position at which the line $L_A$ crosses the line $L_C$ that is line-symmetric to the line $L_A$ with respect to a straight line normal to the second surface 122 of the first projected portion 12c1 in the vicinity of the upper end of the second surface 122 as illustrated in FIG. 3C. Accordingly, most of the first light reflected at the second surface 122 can be re-reflected at the adjacent first surface 121 to travel in an upward direction.

Preferably, the wavelength conversion member 12 has the plurality of projected portions 12c within an area which is irradiated with the first light from the laser light source 11 at a time. Accordingly, deviation of the light emission intensity distribution of the first light in the top view can be reduced. Specifically, the width $W_1$ of each of the plurality of projected portions 12c may be in a range of 5 μm or more to 80 μm or less. The height H of each of the plurality of projected portions 12c may be in a range of 3 μm or more to 35 μm or less. When like the projected portion 12c shown in FIG. 2, the projected portion 12c has such a shape that the bottom of the groove 12d and an area in the vicinity thereof are not irradiated directly with the first light from the laser light source 11, it is preferred to reduce the width $W_1$. Accordingly, the distance between regions irradiated directly with the first light can be reduced, and therefore the luminance distribution can be made more uniform. Specifically, the width $W_1$ of each of the plurality of projected portions 12c is preferably in a range of 5 μm or more to 20 μm or less. Here, for example, the height H of each of the plurality of projected portions 12c is preferably in a range of 3 μm or more to 10 μm or less. The width $W_1$ of the projected portion 12c is the shortest distance between one end and the other end of the projected portion 12c in the second direction $A_2$ in top view. The height H of the projected portion 12c is the shortest distance between the reference surface B and the upper end of the projected portion 12c.

In top view, the length of the projected portion 12c in the first direction $A_1$ is preferably large enough for the first surface 121 to function as a reflecting surface. Specifically, the length of the projected portion 12c in the first direction $A_1$ can be made larger than the width $W_1$. For example, the length of the projected portion 12c in the first direction $A_1$ is made equal to the length of the wavelength conversion member 12 in the first direction $A_1$.

As shown in FIG. 1B, all projected portions 12c can be made to have the same size. On the other hand, since the incidence angle of the first light to the wavelength conversion member 12 slightly varies within the upper surface 12A, the size and the inclined angle of the projected portion 12c can be accordingly varied within the upper surface 12A.

The number of projected portions 12c disposed within an area which is irradiated with the first light from the laser light source 11 at a time is, for example, 3 or more. As shown in FIG. 1B, an outer edge portion of the wavelength conversion member 12 along the first direction $A_1$ is not required to be provided with projected portions 12c. For example, a flat surface substantially parallel to the reference surface B can be disposed on the outer edge portion of the wavelength conversion member 12 along the first direction $A_1$, and the plurality of projected portions 12c can be disposed inside the outer edge portion. The reference surface B is, for example, a surface parallel to a lower surface 12B which is a surface opposite to the upper surface 12A.

The upper surface 12A of the wavelength conversion member 12 can be constituted by only the plurality of projected portions 12c within an area which is irradiated with the first light from the laser light source 11 at a time. That is, adjacent projected portions 12c can be continuously disposed. For example, the plurality of projected portions can be formed in such a manner that one projected portion 12c includes only one first surface 121 and one second surface 122, and the first surface 121 and the second surface 122 are continuous with each other over two adjacent projected portions. The first surface 121 and the second surface 122 are typically flat surfaces, but may have projected portions and recessed portions in the surface as long as the first light can be reflected in an intended direction. For example, a height difference smaller than the height H of the projected portion 12c may exist on the first surface 121 or the second surface 122.

The wavelength conversion member 12 contains one kind of fluorescent material or a mixture of two or more kinds of fluorescent material. The fluorescent material contained in the wavelength conversion member 12 is excited by the first light to emit the second light as fluorescent light. The first light and the second light are mixed to obtain, for example, white light. In this specification, when there are two or more kinds of fluorescent material, all the light emitted by these fluorescent materials is included in the second light. When the first light is blue light, white light can be obtained as mixed light of the first light and the second light by selecting yellow light, or yellow light and red light as the second light. Examples of the fluorescent material which emits yellow light include YAG and LAG. Examples of the fluorescent material which emits red light include CASN and BSESN. The fluorescent material can be included in the projected portion 12c. In other words, the fluorescent material can be included in a portion of the wavelength conversion member 12 above the reference surface B. However, when only the projected portion 12c contains the fluorescent material, wavelength conversion may be insufficient. Thus, it is preferred that in the wavelength conversion member 12, a portion below the reference surface B also contains the fluorescent material. A light-transmissive material (e.g. alumina) having a refractive index different from that of the fluorescent material can be mixed with the wavelength conversion member 12. Accordingly, light can be scattered in the wavelength conversion member 12, and extracted from the upper surface 12A.

(Laser Light Source 11)

The laser light source 11 emits the first light that excites the fluorescent material contained in the wavelength conversion member 12. The wavelength conversion member 12 is irradiated with the first light in a direction different from an upward direction from the wavelength conversion member 12 (i.e. light extraction direction). In this arrangement, light from the wavelength conversion member 12 travels principally in a direction different from a direction toward the laser light source 11, and therefore the necessity of a member that blocks light traveling toward the laser light source 11 from the wavelength conversion member 12 can be eliminated. Further, in this arrangement, the safety of the light emitting device 10 can be improved. If the light emitting device has the laser light source 11 disposed above the wavelength conversion member 12, the light extraction direction to the outside of the light emitting device and the optical path of laser light emitted by the laser light source 11 may be almost coincident with each other in case where the wavelength conversion member 12 is dislocated from a laser light irradiation position due to, for example, detachment of the wavelength conversion member 12. In this case, laser light is directly extracted to the outside of the light emitting device. However, when the light emitting device 10 has the laser light source 11 disposed in a direction different from an upward direction from the wavelength conversion member 12, it can be ensured that the light extraction direction to the outside of the light emitting device and the optical path of laser light emitted by the laser light source 11 are not coincident with each other even if the wavelength conversion member 12 is dislocated. Accordingly, laser light is hardly extracted directly to the outside of the light emitting device 10 even if the wavelength conversion member 12 is dislocated. Thus, the light emitting device 10 with high safety can be obtained.

As the laser light source 11, for example, a semiconductor laser element can be used. The semiconductor laser element, and at least one member such as an optical member such as a lens, a fiber and a reflecting mirror may be combined, and collectively designated as the laser light source 11. The laser light source 11 is disposed in such a manner that the optical axis L of the first light emitted from the laser light source 11 is situated at the surface of any one of the plurality of projected portions 12c. A first light irradiation region of the wavelength conversion member 12 is smaller than, for example, the upper surface 12A. The first light irradiation region can be specified as, for example, a region that is irradiated with a part of the first light which has an intensity ranging from a peak intensity value downward to a certain intensity of, for example, $1/e^2$.

The first light emitted from the laser light source 11 is laser light (coherence light) until it arrives at the wavelength conversion member 12 after being emitted from the laser light 11, but the first light after it is reflected at the upper surface 12A of the wavelength conversion member 12, and the first light extracted to the outside after entering the wavelength conversion member 12 may be non-laser light (incoherence light). Light which originates from the laser light source 11 and which is not subjected to wavelength conversion (e.g. blue light) is defined as the first light irrespective of whether it is laser light or not.

The first light may be, for example, light having a peak wavelength in a range of 350 nm to 600 nm. When the first light is combined with a yellow fluorescent material such as YAG to obtain white light, the first light having a peak wavelength in a range of 430 nm to 460 nm is preferred. Examples of the light source which emits laser light having such a peak wavelength include GaN-based semiconductor laser elements. The GaN-based semiconductor laser element has a quantum well structure including a well layer of, for example, InGaN.

(Light Reflecting Member 13)

As shown in FIG. 1B, the lower surface 12B of the wavelength conversion member 12 may be provided with a light reflecting member 13. When the first light and/or the second light is reflected in an upward direction by the light reflecting member 13, the light extraction efficiency of the light emitting device 10 can be further improved. For example, the light reflecting member 13 includes a dielectric multilayer film and/or a metal film which reflects both the first light and the second light.

(Light Emitting Device)

Figure 4:
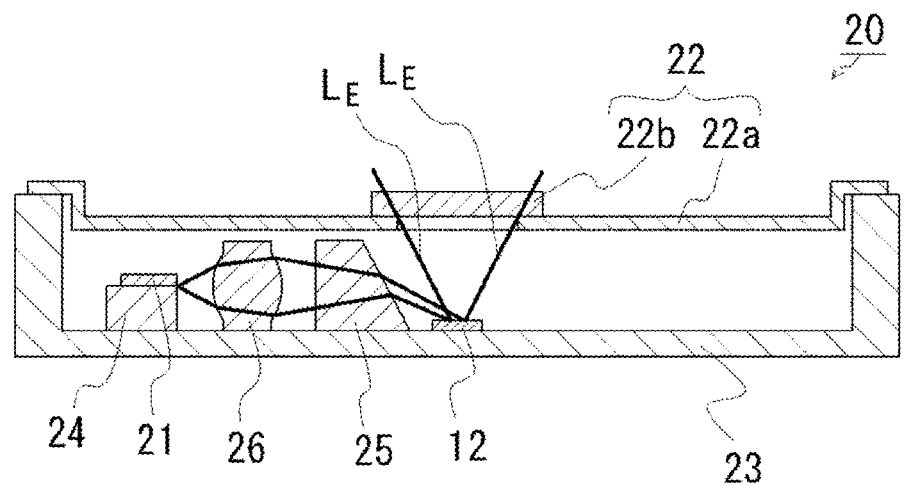
FIG. 4 is a schematic sectional view showing an example of a light emitting device.

A laser package as a light emitting device 20 is shown in FIG. 4. FIG. 4 is a schematic sectional view of the light emitting device 20. As shown in FIG. 4, the light emitting device 20 includes a base member 23, and a lid 22 bonded to the base member 23, and the base member 23 and the lid 22 form an enclosed space. The enclosed space is, for example, a hermetically enclosed space. In this enclosed space, a laser element as a laser light source 21 which emits the first light, and the wavelength conversion member 12 including a fluorescent material which is excited by the first light to emit the second light are disposed. The lid 22 includes a light shielding portion 22a made of metal etc., and a light-transmissive portion 22b made of glass etc., and the light-transmissive portion 22b is disposed so as to close an opening provided in the light shielding portion 22a.

In the light emitting device 20, a light extraction direction, i.e. "upward direction" can be determined according to a positional relation between the opening in the light shielding portion 22a and the wavelength conversion member 12. For extracting light to the outside from the enclosed space of the light emitting device 20, it is necessary to cause the light to pass through the opening in the light shielding portion 22a. Thus, here, the upward direction is a direction connecting the upper surface of the wavelength conversion member 12 and the opening in the light shielding portion 22a.

The "upward direction" can also be defined by a straight line connecting the outer edge of the first light irradiation region on the upper surface of the wavelength conversion member 12 and the outer edge of the opening in the light shielding portion 22a (line $L_E$ in FIG. 4). Here, the inclined angle of the line $L_B$ with respect to the reference surface B may be made larger than the inclined angle of the line $L_E$ with respect to the reference surface B of the wavelength conversion member 12. The inclined angle is an angle which is formed with respect to the reference surface B and which is 90° or less. Accordingly, the first light can be reflected in an upward direction, i.e. a light extraction direction by the projected portion 12c of the wavelength conversion member 12. For example, the inclined angle of the line $L_B$ shown in FIG. 2 is about 80°, and is thus larger than the inclined angle of the line $L_E$ (about 60°) shown in FIG. 4. In the case of the projected portion 12c having the second surface 122, similarly the inclined angle of the line $L_D$ with respect to the reference surface B may be made larger than the inclined angle $L_E$ with respect to the reference surface B. For example, the inclined angle of the line $L_D$ shown in FIG. 3A is about 80°, and is thus larger than the inclined angle of the line $L_E$ (about 60°) shown in FIG. 4.

The laser light source 21 (laser element) is mounted on the base member 23 directly or with a sub-mount 24 interposed therebetween in such a manner that for example, the emission direction of the first light is substantially parallel to the bottom surface in the enclosed space. Here, a transparent body 25 such as a prism is disposed in the enclosed space, and the first light is refracted downward by means of a difference in refractive index between the transparent body 25 and a gas filled into the enclosed space. Accordingly, the upper surface of the wavelength conversion member 12 can be irradiated with the first light. With consideration given to a spread angle of laser light, a lens 26 may be provided on an optical path for the first light and between the laser light source 21 and the transparent body 25. As the lens 26, a converging lens or a collimating lens is selected.

In the light emitting device 20, the optical axis of the first light for defining the projected portion 12c is the optical axis of the first light in a region just before the light is incident to the wavelength conversion member 12. In FIG. 4, the projected portion 12c is defined by the optical axis of the first light in a region after the first light passes through the transparent body 25 and before the wavelength conversion member 12 is irradiated with the first light.

Figure 5:
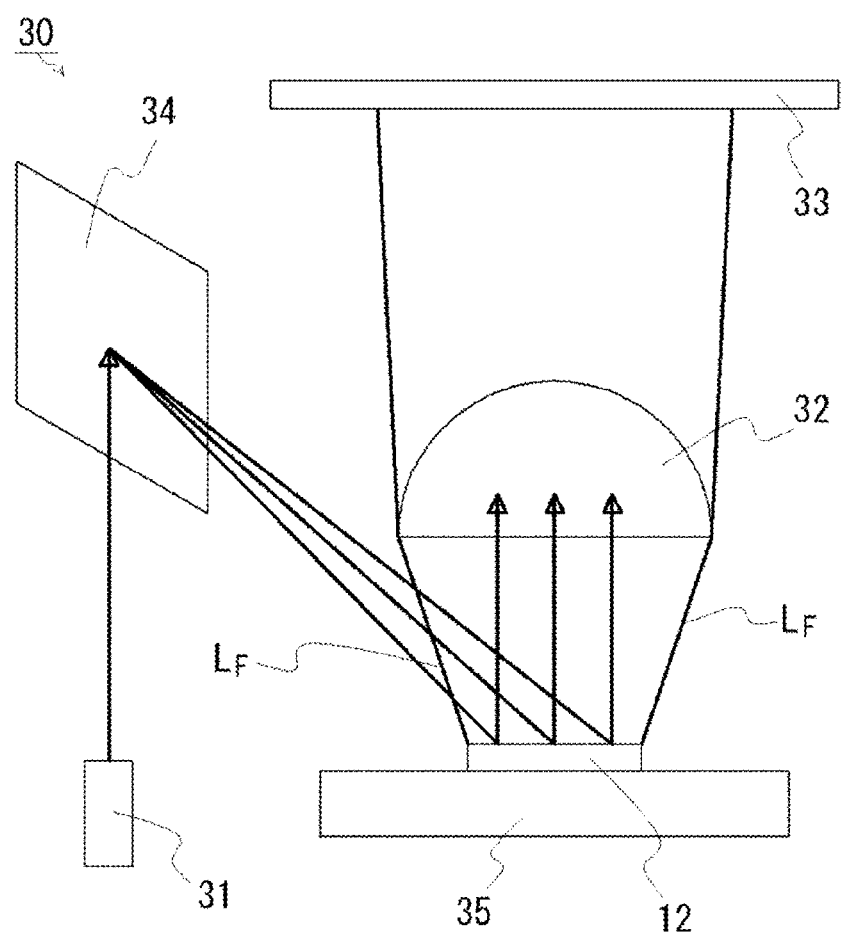
FIG. 5 is a schematic view showing another example of a light emitting device.

A laser module as a light emitting device 30 is shown in FIG. 5. As shown in FIG. 5, the light emitting device 30 includes a solid light source as a laser light source 31 which emits first light; the wavelength conversion member 12 which is irradiated with the first light; and an optical system 32 such as a lens to which the first light and the second light are incident from the wavelength conversion member 12.

The first light and the second light pass through the optical system 32, and are then extracted to the outside from, for example, a window 33.

In the light emitting device 30, the "upward direction" is a direction connecting the upper surface of the wavelength conversion member 12 and the light incidence surface of the optical system 32. As in the case of the light emitting device 20, the "upward direction" can also be defined by a straight line connecting the outer edge of the first light irradiation region on the upper surface of the wavelength conversion member 12 and the outer edge of the light incidence surface of the optical system 32 (line $L_F$ in FIG. 5). Here, the inclined angle of the line $L_B$ with respect to the reference surface B is made larger than the inclined angle of the line $L_F$ with respect to the reference surface B of the wavelength conversion member 12. Accordingly, the first light can be reflected in an upward direction, i.e. a light extraction direction by the projected portion 12c of the wavelength conversion member 12. In the case of the projected portion 12c having the second surface 122, similarly the inclined angle of the line $L_D$ with respect to the reference surface B is made larger than the inclined angle $L_F$ with respect to the reference surface B.

The light emitting device 30 may include a reflection mechanism 34 which reflects the first light emitted by the laser light source 31 toward the wavelength conversion member 12. The reflection mechanism 34 includes, for example, a microelectromechanical systems (MEMS) device such as a digital micromirror device having a large number of mirror surfaces. Accordingly, the first light irradiation position in the wavelength conversion member 12 can be made variable. The laser light source 31 is, for example, a laser package obtained by hermetically enclosing a semiconductor laser element. The light emitting device 30 may include a heat dissipater 35 thermally connected to the lower surface of the wavelength conversion member 12. When the first light irradiation position is made variable by the reflection mechanism 34 etc., accordingly the direction of the first light applied to the wavelength conversion member 12, i.e. the inclination of the optical axis with respect to the reference surface B may also be variable. Here, for example, the projected portion 12c is formed using as a reference the optical axis of a part of the applied first light which travels to the central part. Alternatively, using as a reference the optical axis of the first light which is actually applied to each part of the wavelength conversion member 12, the projected portion 12c of each part may be formed.

(Modification of Wavelength Conversion Member 12)

Figure 6A:
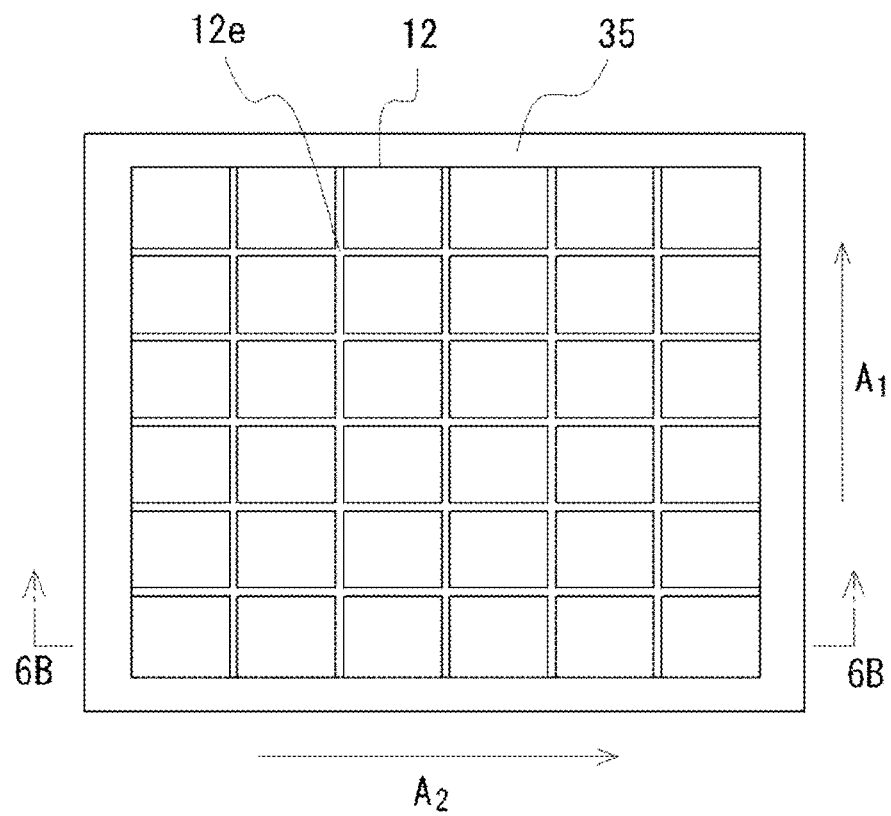
FIG. 6A is a schematic top view showing a modification of a wavelength conversion member.
Figure 6B:
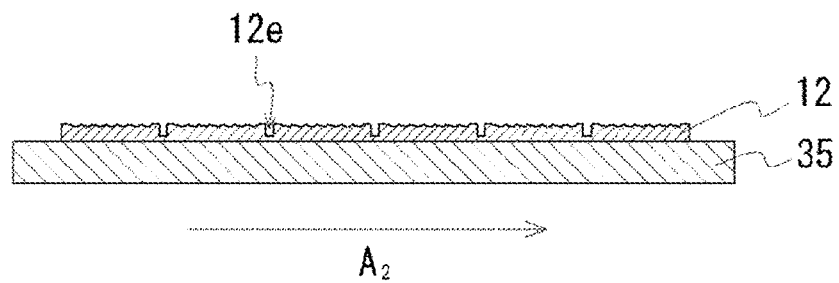
FIG. 6B is a schematic sectional view taken along line 6B-6B in FIG. 6A.
Figure 6C:
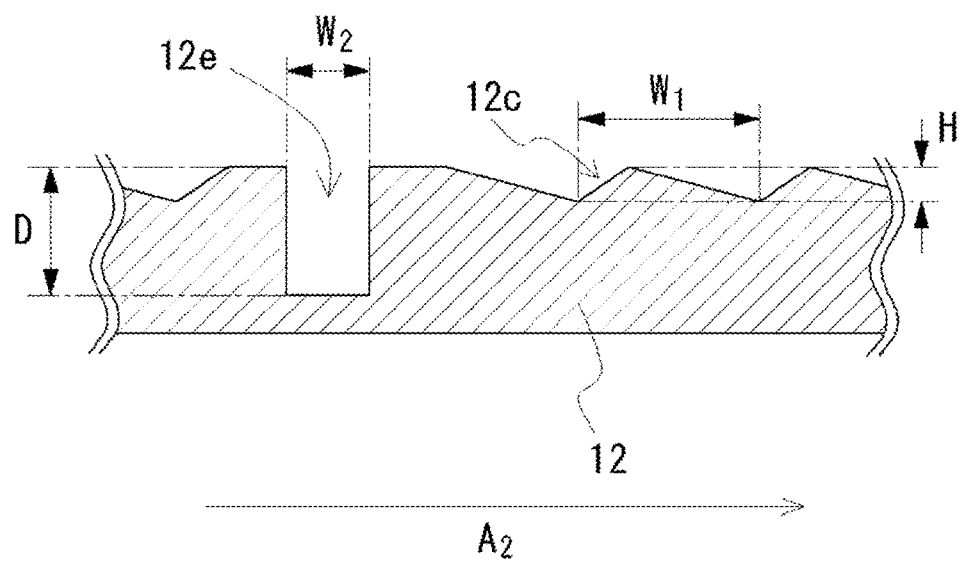
FIG. 6C is a partial enlarged view of FIG. 6B.

The wavelength conversion member 12 may include a notched portion 12e. An example thereof is shown in FIGS. 6A to 6C. FIG. 6A is a schematic top view showing the wavelength conversion member 12, and FIG. 6B is a schematic sectional view taken along line 6B-6B in FIG. 6A. FIG. 6C is a partial enlarged view of FIG. 6B.

The notched portion 12e is provided in a grid shape when viewed from above. A plurality of projected portions 12c is provided in at least a part of a region surrounded by the grid-shaped notched portion 12e. Accordingly, spread of light in the wavelength conversion member 12 can be limited by the notched portion 12e in application of the first light to regions surrounded by the notched portion 12e. Thus, the wavelength conversion member 12 having the notched portion 12e is particularly suitable for the light emitting device 30 in which the first light irradiation position in the wavelength conversion member 12 is variable.

Further, a light shielding member may be embedded in the notched portion 12e. For example, the first light irradiation region is sized to fit within a region surrounded by the notched portion 12e. The width $W_2$ of the notched portion 12e may be in a range of 3 µm or more to 10 µm or less. The width $W_2$ of the notched portion 12e can be made smaller than the width $W_1$ of the projected portion 12c as shown in FIG. 6C. The depth D of the notched portion 12e is preferably smaller than the height H of the projected portion 12c for limiting spread of light in the wavelength conversion member 12. The depth D of the notched portion 12e is, for example, 30 µm or more, or 50 µm or more. The depth D of the notched portion 12e may be such a depth that the wavelength conversion member 12 is fully divided. The notched portion 12e may be formed by mechanical cutting, or formed by chemical etching or molding.

EXAMPLES

Example 1

Figure 7A:
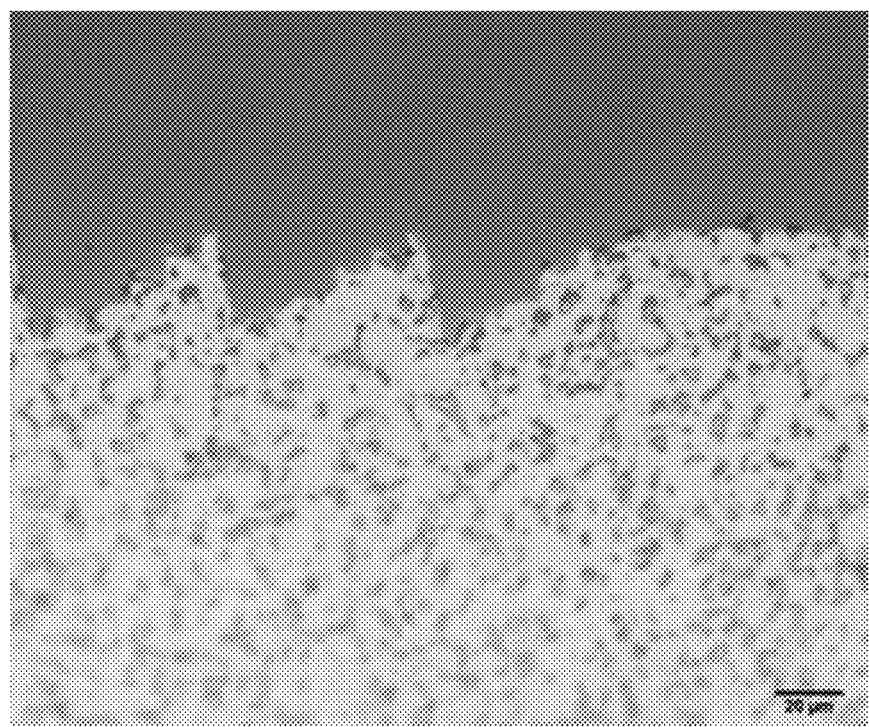
FIG. 7A is a photograph of a cross-section of a wavelength conversion member to be used in a light emitting device in Example 1.

A wavelength conversion member having a shape as shown in FIG. 2 was prepared as the wavelength conversion member 12 of Example 1. The wavelength conversion member 12 of Example 1 has the plurality of projected portions 12c each extending in the first direction $A_1$ and arranged side by side in the second direction $A_2$. The plurality of projected portions 12c is each shaped to have the first surface 121. The shape of the wavelength conversion member 12 in plan view is substantially a square having a size of about 1 mm×1 mm, and the thickness of the wavelength conversion member 12 is about 100 µm. The upper surface of the wavelength conversion member 12 is provided with 16 projected portions 12c having the same shape. The projected portions 12c each have a width of about 60 µm and a height of about 30 µm. The projected portion 12c includes two surfaces including the first surface 121. The first surface 121 is positioned so as to be irradiated directly with laser light, and the other surface is positioned so as not to be irradiated directly with laser light. The angle formed by the first surface 121 and the other surface is about 70°. The wavelength conversion member 12 contains YAG as a fluorescent material. A photograph of a cross-section of the prepared wavelength conversion member 12 is shown in FIG. 7A. FIG. 7A is an optical microscope photograph, and the straight line at the lower right in FIG. 7 is a line corresponding to a length of 20 µm. The same wavelength conversion member as the wavelength conversion member 12 was used to prepare a measurement sample having the same structure as that of the light emitting device 20 (laser package) shown in FIG. 4 except that the lid 22 was not provided. As the laser light source 21 (laser element), a GaN-based semiconductor laser element which emits laser light (first light) having a peak wavelength of about 450 nm was used. The angle of the first surface 121 of the projected portion 12c with respect to a direction L parallel to the optical axis of laser light applied to the wavelength conversion member 12 was about 55°.

Figure 7B:
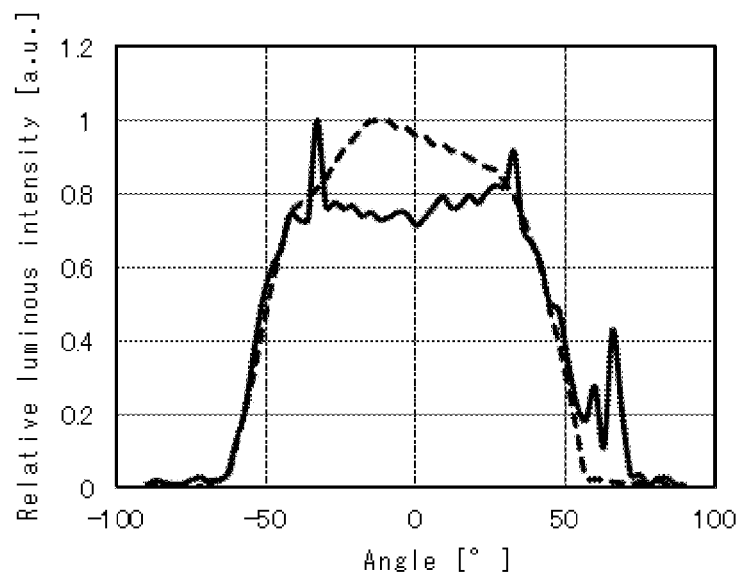
FIG. 7B is a graphical view showing a light distribution characteristic of the light emitting device in Example 1.

For the measurement sample, a light distribution characteristic was measured. The results are shown in FIG. 7B. The results shown in FIG. 7B are measurement results in the second direction. In FIG. 7B, the abscissa represents a position in the second direction with the upward direction set to 0°, and the ordinate represents a relative luminous intensity with the maximum luminous intensity set to 1. In FIG. 7B, the solid line represents blue light (first light), and the broken line represents yellow light (second light). The first light from the laser light source 11 was applied to the wavelength conversion member 12 in a direction of about −70°.

Comparative Example

Figure 8:
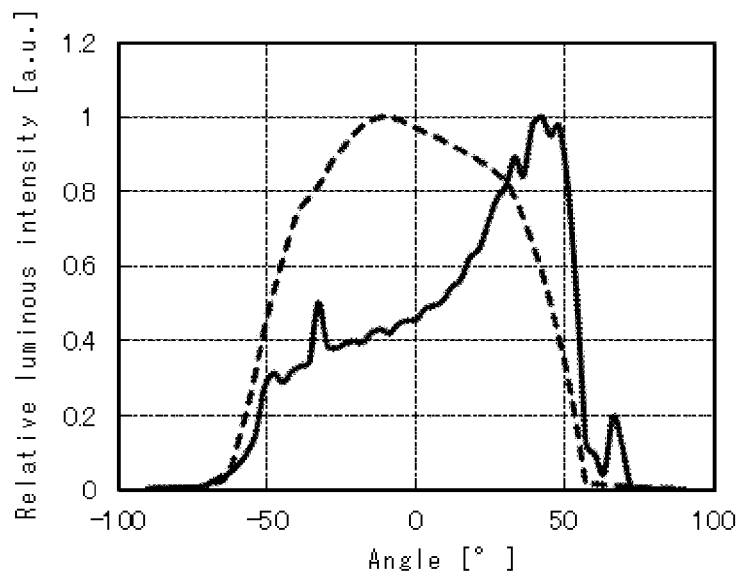
FIG. 8 is a graphical view showing a light distribution characteristic of a light emitting device in a comparative example.

A wavelength conversion member of a comparative example is the same as the wavelength conversion member 12 of Example 1 except that projected portions are not provided. The wavelength conversion member of the comparative example was used to prepare a measurement sample including the same members as in Example 1, and a light distribution characteristic was measured. The results are shown in FIG. 8. The results shown in FIG. 8 are measurement results in the second direction. In FIG. 8, the abscissa represents a position in the second direction with the upward direction set to 0°, and the ordinate represents a relative luminous intensity with the maximum luminous intensity set to 1. In FIG. 8, the solid line represents blue light (first light), and the broken line represents yellow light (second light). The first light from the laser light source 11 was applied to the wavelength conversion member in a direction of about −70°.

Evaluation of Example 1

By using the wavelength conversion member 12 of Example 1, the light distribution characteristic for blue light (the first light) was improved as compared to the case where the wavelength conversion member of the comparative example was used as shown in FIGS. 7B and 8. Specifically, in FIG. 8, the luminous intensity of blue light was the maximum around +50°, and in FIG. 7B, the luminous intensity of blue light was the maximum around −30° and around +30°, and these positions were closer to the position at which the luminous intensity of yellow light (the second light) was the maximum. The luminous intensity of yellow light is the maximum around −12° in both FIGS. 7B and 8. Thus, by providing the wavelength conversion member 12 with projected portions 12c each having the first surface 121, the position of the maximum luminous intensity of the first light can be made closer to the position of the maximum luminous intensity of the second light. Accordingly, when the lid 22 is provided, a part having the maximum luminous intensity can be extracted to the outside for each of the first light and the second light, so that the light extraction efficiency of the light emitting device 20 can be improved.

What is claimed is:

1. A light emitting device comprising:
   a laser light source configured to emit first light;
   a wavelength conversion member containing one kind of fluorescent material or a mixture of two or more kinds of fluorescent material, and configured to emit second light, the wavelength conversion member including
      an upper surface arranged to be irradiated with the first light, and
      a plurality of projected portions each extending along a first direction on an upper surface side of the wavelength conversion member and arranged side by side in a second direction perpendicular to the first direction, each of the plurality of projected portions having a first surface extending along the first direction, the first surface being inclined with respect to a reference surface on which bottoms of a plurality of grooves defined by the plurality of projected portions are arranged;
   a base member; and a lid bonded to the base member, the base member and the lid enclosing the laser light source and the wavelength conversion member, the laser light source and the wavelength conversion member being arranged so that the first light and the second light are extracted from the upper surface side of the wavelength conversion member, an optical axis of the first light extends along the second direction when viewed from above and is inclined with respect to the reference surface, and light directly incident to the first surface along a direction parallel to the optical axis of the first light is regularly reflected toward an upward direction.

2. The light emitting device according to claim 1, wherein each of the plurality of projected portions further has a second surface extending along the first direction when viewed from above and inclined with respect to the reference surface so that light along the direction parallel to the optical axis of the first light is directly incident to the second surface, and the first surface and the second surface of each of the plurality of projected portions are arranged so that the first light regularly reflected at the second surface of one of the plurality of projected portions is regularly reflected toward the upward direction at the first surface of an adjacent one of the plurality of projected portions.

3. The light emitting device according to claim 2, wherein an area of the second surface is larger than an area of the first surface in each of the plurality of projected portions.

4. The light emitting device according to claim 1, wherein a width of each of the plurality of projected portions is in a range of 5 μm to 80 μm.

5. The light emitting device according to claim 1, wherein a height of each of the plurality of projected portions is in a range of 3 μm to 35 μm.

6. The light emitting device according to claim 1, wherein the wavelength conversion member has a notched portion arranged in a grid shape when viewed from above, and the plurality of projected portions are arranged in at least a part of a region surrounded by the notched portion.

7. The light emitting device according to claim 6, wherein a width of the notched portion is in a range of 3 μm to 10 μm.

8. A light emitting device comprising:

a laser light source configured to emit first light;

a wavelength conversion member containing one kind of fluorescent material or a mixture of two or more kinds of fluorescent material, and configured to emit second light, the wavelength conversion member including an upper surface arranged to be irradiated with the first light, and a plurality of projected portions each extending along a first direction on an upper surface side of the wavelength conversion member and arranged side by side in a second direction perpendicular to the first direction, each of the plurality of projected portions having a first surface extending along the first direction, the first surface being inclined with respect to a reference surface on which bottoms of a plurality of grooves defined by the plurality of projected portions are arranged; and a reflection mechanism configured to reflect the first light emitted by the laser light source toward the wavelength conversion member, the laser light source and the wavelength conversion member being arranged so that the first light and the second light are extracted from the upper surface side of the wavelength conversion member, an optical axis of the first light extends along the second direction when viewed from above and is inclined with respect to the reference surface, and light directly incident to the first surface along a direction parallel to the optical axis of the first light is regularly reflected toward an upward direction.

9. The light emitting device according to claim 8, wherein the reflection mechanism is a microelectromechanical systems device.

10. A wavelength conversion member comprising:

an upper surface;

one kind of fluorescent material or a mixture of two or more kinds of fluorescent material; and a plurality of projected portions each extending along a first direction on an upper surface side of the wavelength conversion member and arranged side by side in a second direction perpendicular to the first direction, each of the plurality of projected portions having a first surface and a second surface, the first surface extending along the first direction and inclined with respect to a reference surface on which bottoms of a plurality of grooves defined by the plurality of projected portions are arranged, the second surface extending along the first direction when viewed from above and inclined with respect to the reference surface, the first surface being arranged so that light along the second direction when viewed from above and inclined with respect to the reference surface is regularly reflected toward an upward direction, and the first surface and the second surface of each of the plurality of projected portions being arranged so that light regularly reflected at the second surface of one of the plurality of projected portions is regularly reflected toward the upward direction at the first surface of an adjacent one of the plurality of projected portions.

11. The wavelength conversion member according to claim 10, wherein an area of the second surface is larger than an area of the first surface in each of the plurality of projected portions.

12. The wavelength conversion member according to claim 10, wherein a width of each of the plurality of projected portions is in a range of 5 μm to 80 μm.

13. The wavelength conversion member according to claim 10, wherein a height of each of the plurality of projected portions is in a range of 3 μm to 35 μm.

14. The wavelength conversion member according to claim 10, further comprising a notched portion provided in a grid shape when viewed from above, wherein the plurality of projected portions are provided in at least a part of a region surrounded by the notched portion.

15. The wavelength conversion member according to claim 14, wherein a width of the notched portion is in a range of 3 μm to 10 μm.

* * * * *